United States Patent [19]

Stafford et al.

[11] Patent Number: 4,754,486
[45] Date of Patent: Jun. 28, 1988

[54] MOTORCYCLE STEREO AUDIO SYSTEM WITH VOX INTERCOM

[75] Inventors: Larry E. Stafford, Mesa; John J. Lazzeroni, 732 E. Stella Rd., Tucson, both of Ariz. 85730

[73] Assignees: John J. Lazzeroni; Melinda K. Lazzeroni, both of Tucson, Ariz.

[21] Appl. No.: 37,557

[22] Filed: Apr. 13, 1987

[51] Int. Cl.[4] .............................................. H04B 1/00
[52] U.S. Cl. ...................................... 381/86; 455/238; 381/56; 381/110; 381/94
[58] Field of Search ....................... 381/25, 56, 72, 74, 381/94, 110, 86; 455/238

[56] References Cited

U.S. PATENT DOCUMENTS 4,380,824  4/1983  Inove ..................................... 381/86
4,677,389  6/1987  OpdeBeek et al. ................. 455/238

FOREIGN PATENT DOCUMENTS 0058733  4/1985  Japan ..................................... 381/86

*Primary Examiner*—Forester W. Isen
*Attorney, Agent, or Firm*—J. Michael McClanahan

[57] ABSTRACT

An improvement to motorcycle intercom communications between the motorcycle driver and passenger providing for stereo listening in each of both right and left helmet earphones wherein intercom communications may be had through microphones always activated located proximate the mouth of both driver and passenger where when initiating speaking over the microphone, the stereo output of one side of the earphones is reduced by approximately one/half while the stereo output of the other side earphones is terminated completely and the intercom conversation is heard in full over that single side of earphones. Upon the termination of the intercom conversation, the invention circuitry returns both sides of earphones to the pre-existing level of stereo output. The above is accomplished by dividing all sounds which come in over the microphone into a low and high frequency range separated by an audio speaking range wherein the outputs of the low and high frequency range filters are constantly sampled and compared with the energy output of the audio speaking range of frequencies. When the energy in the speaking range of frequencies exceeds the energy in the low and high frequency range, such is indicative that a party is speaking into the microphone and the circuit automatically terminates the output of one earphone, reduces the other by half, and injects the intercom on the earphone whose stereo had been terminated.

19 Claims, 2 Drawing Sheets

MOTORCYCLE STEREO AUDIO SYSTEM WITH VOX INTERCOM

BACKGROUND OF THE INVENTION

1. Field of the Invention.

The field of the invention is motorcycle stereo and intercom systems between the motorcycle rider and passenger.

2. Description of the Related Art.

Currently available are audio stereo systems for motorcycle riders and passengers as motorcycle accessories which provide means by which the motorcycle rider and passenger may enjoy stereo music from a carried tape cassette player or radio receiver. These systems comprise primarily two channel amplifier systems that input into the jack receptacle of tape cassette players and radio receivers, amplifying the sound in each channel and then directing it to sets of earphones or headsets worn by the motorcycle driver and passenger. In many cases, earphones are fitted interiorly to the protective helmet worn by the rider and passenger and so oriented that the left channel of the stereo will appear in each of the left helmet earphones of the rider and passenger, and the right stereo channel appearing in the right helmet earphones of the motorcycle rider and passenger. In these cases, electrical cords connect to the earphone of each the rider and the passenger and plug into convenient connectors or jacks of the sound system to receive the stereo audio entertainment.

The problems come when attempts are made to interconnect the stereo system with an intercom microphone system which permits intercommunication between the rider and passenger while traveling on the motorcycle. In most cases, the microphone is similarly attached to each helmet worn by the motorcycle rider and passenger such that it at all times is immediately forward of, but in close proximity to the party's mouth. For such systems, inherent problems reside in the fact that wind noise and other outside noises are picked up in addition to the spoken word by the microphone and sent into the interconnected stereo and intercom system. One solution has been to activate the microphones of the intercom system by means of separate on/off switches so that they may be turned on when one of the parties wishes to speak, and then turned off at the conclusion of the conversation. Of course, systems of these type remove the previously listened to stereo or radio programs from the earphones, so what would have been said on these programs have been lost. This may be vary important, especially if one were listening to the news or waiting for an announcement.

Other solutions have been to have the microphone system on all the time, yet, adjust the sensitivity of the system so that noise and other sounds below a certain level are not amplified throughout the system, and, when speaking above that noise level, the speaking voice will be amplified and placed upon the earphones of both parties. However, systems of this type always need continuous adjustment depending upon the noise level. Unfortunately also, the noise level appears to rise as a direct function of the speed of the motorcycle, thus continually requiring adjustment of the sensitivity level to eliminate the noise. That, of course, introduces additional problems, such as if the motorcycle has been traveling at a high rate of speed when last using the intercom system and the motorcycle then slows down, the manually adjusted sensitivity control is set so high that when utilizing the intercom system, the voice may not exceed the previously set sensitivity for a relatively loud noise level and thus not be heard.

In addition, many of these VOX systems (voice activated systems) are such that they turn off immediately at the end of the last word of the person speaking so that if there is a pause between the words of the speaker, the system will have already shut down. Then, when the system comes back on for the next word spoken, the first word will appear chopped or missing altogether by the time it takes the system to get back activated.

Further, the problems with the VOX systems currently available as motorcycle accessories are exacerbated with the new style of sport type motorcycles presently coming upon the market in that they have smaller farings and less wind protection for the driver and passenger than the touring type motorcycles, and consequently more outside and extraneous noise are present.

Thus it is obvious that there is need for a stereo audio system with VOX intercom which overcomes the problems above discussed, i.e., that will automatically compensate for increased wind and other noise so that both the rider and passenger are not constantly having to adjust the sensitivity control to compensate for varying wind and other noises, and for a VOX system that stays on for a period of time even after the last person has spoken until it is reasonably clear that there will be no more conversation, and then, after muting the stereo system, brings the system back to full volume.

Additionally, it is obvious that there is a need for a motorcycle stereo audio system with VOX intercom which permits the monitoring of the stereo audio system while the VOX intercom system is being used.

These and other objects and needs are set out in the enclosed specification of Applicant's invention.

SUMMARY OF THE INVENTION

The embodiment of the invention described consists of a motorcycle stereo audio system with VOX intercom wherein the electronic circuit automatically compensates for increased wind and other noises by comparison of newly arrived noises which impinge on the microphone with sounds which existed to that point. The system is installed on a motorcycle, the bike is then taken out and ridden at the speed which creates the maximum noise, generally the legal speed limit, and the sensitivity potentiometer set at that point where the noise is not passed into the intercom system. This sensitivity setting will be different for different motorcycles, different type farings on motorcycles, different helmets, microphones, speakers in helmets, however, once it has been set then it will not need again be utilized.

More specifically, the subject invention segregates all sounds in the audio range coming into the microphone into three frequency ranges. Many frequencies which appears as noise in a system and which are due to wind or vibrations are relatively low frequency noise, in many cases less than 20 cycles per second. Additionally, many other noises, such as sirens, may have a frequency principally above 6 kilocycles per second. Accordingly, the speaking audio range, nominally 500 hz to 4 khz, is segregated within the intercom system and is the frequency range through which the intercom system is operated. Audio sounds having a frequency below 200 hz, and above 6 khz, are also segregated and then used as a means for comparison of the energy contained in these low and high bands to the energy in the audio speaking band. Thus, at all times, means are provided whereby no absolute level of noise or speaking into the microphone will interject itself into the VOX intercom system, but always a comparison is made between surrounding ambient noise in the low and high bands to noise or other speaking in the audio range. Therefore only when the relative level of speaking is above the noise detected in the low and high bands of frequencies does the speaking interject itself into the VOX intercom system and on to the earphones worn by the motorcycle rider and passenger.

Accordingly, once sensitivity has been set for the system on the motorcycle at the level of highest noise, no more setting is necessary and the VOX intercom system and the microphones remain on at all times and will operate to impart the spoken words into the earphones of the rider and passenger only when the microphone is spoken into regardless of the level of the outside noise. However, when an extremely loud noise is perceived which does have energy in the audio speaking range, such as a nearby siren, the system permits the sound of the siren to actuate the VOX intercom system so that the rider and passenger, for safety's sake, are permitted to hear the sounds so that they may react to it as needed. After the sound has passed away, the system returns to its prior state.

Accordingly, the system, as operating, channels the left and right output of a stereo cassette player, or radio receiver into each of the left and right helmet earphones of both rider and passenger respectively, only interrupted by the presence of speaking or possible emergency sounds in the audio frequency range. When that happens, the previously existing music or sound in the right stereo channel is dropped out completely in both the right helmet earphones while the left channel stereo music or radio receiver sound is muted by approximately one/half in both the left helmet earphones. The intercom system then works fully in the right helmet earphone of both the rider and passenger simultaneously. By this means, the radio receiver, still playing at one/half sound in the left ear, may still be monitored for something that the party's were listening for and when it is heard, merely by terminating the intercommunication, in 3 to 4 seconds, the radio receiver or stereo player is brought back up to its full restored volume in both the left and the right ears.

The above is accomplished by means of three filters, a low pass filter which cuts off at approximately 200 hz, a band pass filter which captures audio signals in the range of 500 hz to 4 khz, and a high pass filter which passes all audio sounds above 6 khz. The outputs of both the low pass and high pass filters are combined, half wave rectified, and then summed by charging a capacitor, the voltage upon which is then directed to the negative input of a high input impedance comparator. The audio signals in the band pass range of 500 hz to 4 khz are similarly half wave rectified and averaged by charging a second capacitor, the output of which is directed to the positive input of the same high input impedance comparator. The comparator is characterized as having a positive voltage output only when the voltage of the positive input exceeds the voltage of the negative input. Upon an output from the comparator, the left stereo channel from the radio receiver or take cassette player is terminated through use of an active attenuator and the right stereo channel is attenuated by half. The audio speaking voice output of the band pass filter is then led directly into the amplifying system for the left earphone in order that it may be there heard.

No signal is directed to the left channel amplifier from the band pass filter until the energy of the audio signals passing through the band pass filter exceed the energy of the signals passing through the low and high filter systems.

By selective use of capacitor draining resistors attached to the two charged capacitors, the output of the comparator during time of the the presence of audio signals in the band pass filtering system is prolonged an additional 3 to 4 seconds after the last word is spoken to ascertain that the speaker is through talking or to give an opportunity to the other party to talk before the left and the right stereo channels are brought back to full volume in both left and right earphones.

Accordingly, it is an object of the present invention to provide a motorcycle stereo audio system with VOX intercom wherein the noise interference level at all speeds and under all conditions is always compensated for before the VOX system becomes operative.

It is another object of the subject invention to provide means for continuing the VOX intercom system on an additional period of time to provide time opportunities between spoken messages.

It is still a further object of the subject invention to provide a motorcycle stereo audio system with VOX intercom wherein the sensitivity control to account for noise may be set once depending on the motorcycle and other surrounding noise generators and then not be re-set for different noise levels of the motorcycle.

Other objects of the invention will in part be obvious and will in part appear hereinafter. The invention accordingly comprises the apparatus possessing the construction, combination of elements, and arrangement of parts which are exemplified in the following detailed disclosure and the scope of the Application of which will be indicated in the claims.

BRIEF DESCRIPTION OF THE DRAWINGS

For further understanding of the features and objects of the subject invention, reference should be had to the following detailed description taken in connection with the accompanying drawings wherein.

In the various views, like index numbers refer to like elements.

DETAILED DESCRIPTION OF THE PREFERRED EMBODIMENT

Figure 1:
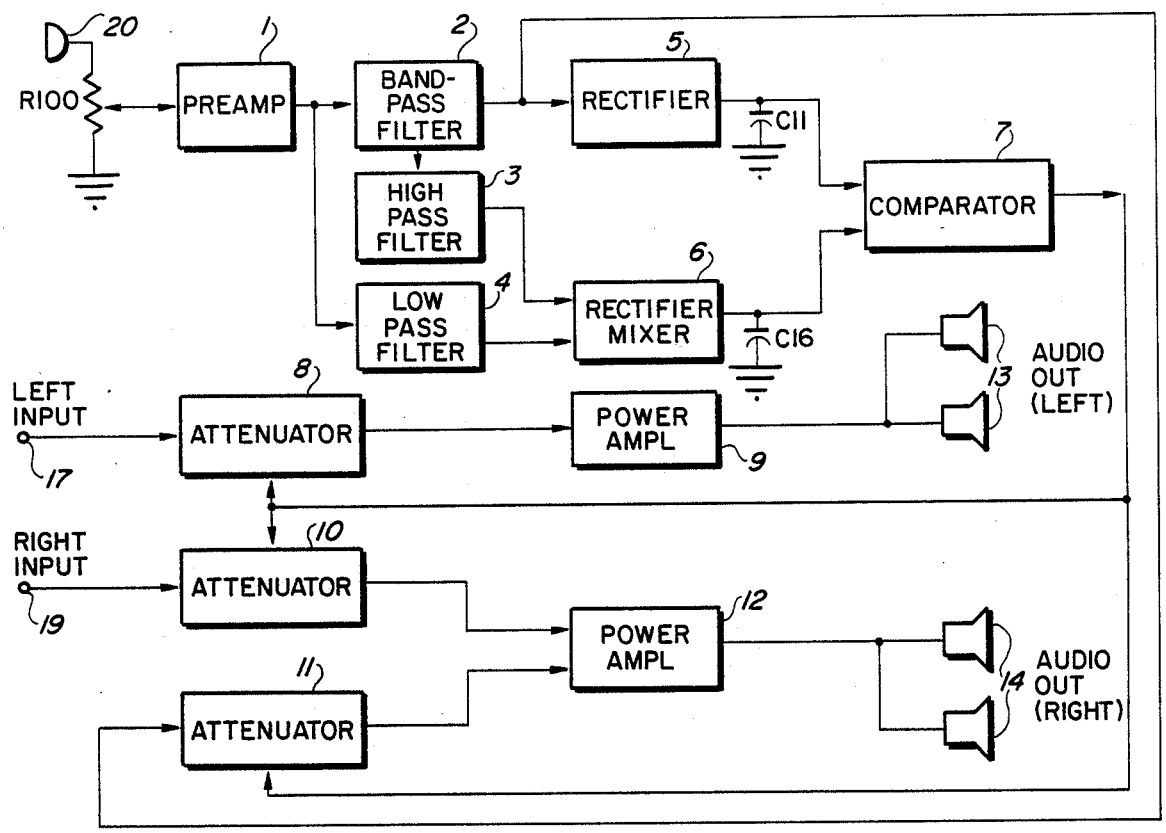
FIG. 1 is a functional block schematic diagram of the subject invention.

Referring now to FIG. 1, a functional block schematic diagram of the subject invention is detailed. Firstly, and beginning at the upper left hand portion of the FIGURE, microphone 20 is shown having its output directed to volume control potentiometer R100, the center tap of which is directed to preamp 1 which provides up to 40 db of gain for the audio signal from the microphone. Thereafter, the output of preamp 1 is directed to band pass filter 2 which passes the audio signals in the frequency range of 500 hz to 4 khz, rejecting frequencies outside this audio range. The output of preamp 1 is also directed to low pass filter 4 which is so designed to pass audio signals having frequencies of 200 hz or less. In addition, band pass filter 2, which includes both a high pass filter and a low pass filter in its construction, first passes all frequencies above 500 hz to a second filter which rejects all frequencies above 4 khz. However, the output of the filter passing 500 hz and above is directed to high pass filter 3 which permits passage of audio frequencies above 6 khz.

Thereafter, the outputs of band pass filter 2, high pass filter 3, and low pass filter 4 are directed to a pair of rectifiers, specifically, the output of band pass filter 2 directed to rectifier 5 and both the outputs of high pass filter 3 and low pass filter 4 to rectifier/mixer 6. The purpose of rectifier 5 is to convert the audio signal from the band pass filter 2, by means of a half wave rectifier, to a dc voltage which will charge capacitor C11, the collected voltage of which will be later compared. Rectifier/mixer 6 converts the audio signals from both the high pass filter 3 and low pass filter 4 to a dc voltage by means of a half wave rectifier, this dc voltage being used to charge capacitor C16, the output of which will also directed to the same comparator as receives the output of rectifier 5 as represented on charged capacitor C11.

The purpose of rectifier 5 and rectifier/mixer 6 is to search for energy in the different audio ranges which will be indicative of certain things. As previously mentioned, the speaking range which has been selected to be amplified and eventually placed on one (nominally, the right) of the earphones of each of the driver and passenger is the audio range of 500 hz to 4 khz. Noise, as previously mentioned, covers all frequencies, however, one disturbing source of noise to the motorcycle rider and his passenger is wind noise due to the passing of the motorcycle through air and the characteristic noise is dependent upon the type of motorcycle, its construction, and most importantly, the shape and size of its cowling. The trend is to make the wind protective cowling on sports type motorcycles of smaller size than the wind protective cowling on the touring type motorcycle. Consequently, the wind noise on sports type motorcycles is greater in amplitude than the wind noise on touring type motorcycles. Further, the great majority of the wind noise is in the low frequency range generally below 200 cycles per second. In addition, high frequency noise, many times noises such as emergency vehicle sirens, also manifest themselves to the rider and are picked up by the microphone and conveyed to the hearing of the motorcycle rider and passenger.

Accordingly, the sounds which are picked up by the microphone and amplified by the preamp may be conveniently divided into different audio ranges, the speaking range of 500 hz to 4 khz and the noise range below and above the speaking range. Obviously, however, noise in the speaking range will be carried through the system as if it were being spoken by the motorcycle rider or passenger into their respective microphones. However, as a practical matter, due to the proximity of the microphone to the mouth of the rider or passenger, in most all cases, except for perhaps emergency vehicles passing very near, the voice of the driver and/or passenger will be greater than all frequency noise. Accordingly, the output of rectifier 5, after storage upon its attendant capacitor C11, is directed into comparator 7 where it is compared with the output of rectifier/mixer 6, also represented by the voltage on a charging capacitor. The output then of comparator 7 is such that it outputs a signal only when the input from rectifier 5, the audio speaking range signal, is greater than the input from the rectifier/mixer 6, the combined audio noise frequencies signal. Such is accomplished by placing the output of rectifier 5 to the positive input of comparator 7, the output of rectifier/mixer 6 to the negative input of comparator 7, and then searching for positive output from comparator 7. Thereafter, the output of comparator 7 is directed to three attenuators, 8, 10, and 11.

Attenuators 8 and 10 receive the left and the right channels respectively of a stereo-audio input, such as from a radio receiver or stereo tape cassette much like the portable carry-around tape players. Since the inventive device is to provide music or other entertainment to the motorcycle driver and passenger, such as stereo music, the left and right stereo channels are passed through attenuators 8 and 10 and on and into the respective left and right helmet earphones of both the driver and passenger, the stereo entertainment is only interrupted by either the driver or passenger using the intercom system, i.e., speaking into the microphone immediately in front of the party's mouth. The microphone is on constantly, however, energy in noise passed by the low and hi pass filters is characteristically greater than the noise passed by the audio speaking range band pass filter 2, and thus the output of comparator 7 is zero, since it only outputs a positive signal when its positive input from rectifier 5 is greater than its negative input from rectifier/mixer 6. Comparator 7 output, when present, act upon attentuators 8 and 10 such that when there is an output from comparator 7, which means that the driver or passenger is speaking into the microphone, attenuator 8, which feeds the left earphone, reduces the left stereo channel signal amplitude by approximately one/half and thus the sound in the left earphone by one/half. At the same time, the output from comparator 7 totally inhibits the right stereo channel signal which theretofore was passing through attenuator 10 so that the output of attenuator 10 goes to zero.

At the same time, the output of band pass filter 2, which is the audio speaking portion, is injected into a third attenuator 11, and allowed to pass through attenuator 11 by virtue of the presence of the output of comparator 7 which has also been directed to attenuator 11. The output of attenuator 8, which is the left stereo channel, is directed to power amplifier 9 which in turn outputs its signal to loudspeaker or earphone 13 which is nominally the left earphone. The output of attenuator 10, the right stereo channel, is directed to power amplifier 12 whose output is directed to loudspeaker or earphone 14, the right side helmet earphones of the rider and passenger. When audio speaking frequencies are present because of an output from band pass filter 2, attenuator 11 is activated while attenuator 10 is deactivated, and the output of attenuator 11 is directed to power amplifier 12 and then on to the right hand speaker or earphone 14.

Consequently, when the intercom between the driver and the passenger is being utilized, the stereo sound in the left helmet earphones of both the driver and passenger is reduced by approximately one/half, while the right channel stereo signal is completely inhibited in the right earphone; however, the intercom comes on unattenuated in the right earphone. By such method, the driver and passenger may communicate between each other. However, if the radio or stereo input is being monitored for some announcement or the like, it will be heard, and, if an emergency vehicle or the like passes in the proximity, such that energy is placed into the speaking range of frequencies, the siren or other overly loud signal will be heard in the right earphone. If the sound is outside the speaking range, i.e., it has more energy in the low and high frequency range than the speaking range of frequencies, comparator 7's output will be inhibited and stereo music will return to the earphones. This, in itself, if happening while the intercom is being used, is a warning to the parties that an emergency vehicle or other loud noise if present.

Functional blocks numbers 1 through 7 comprise the intercom system, blocks 8 and 9 the left attenuator and amplifier system, blocks 10 and 12 the right attenuator and amplifier system, and block 11 the intercom attenuator.

Figure 2:
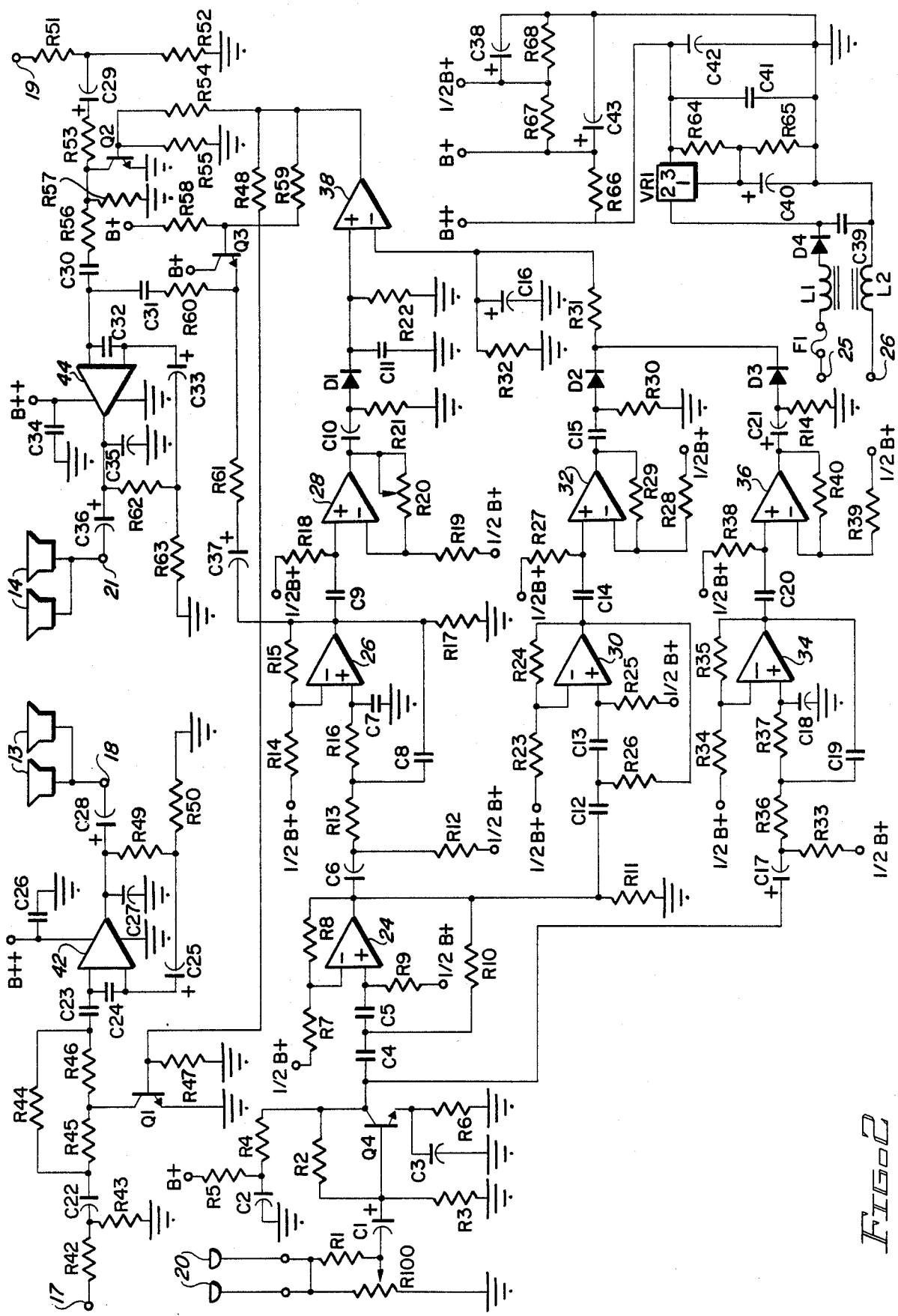
FIG. 2 is a complete schematic of the subject invention.

Referring now to FIG. 2, a complete schematic of the subject invention is detailed. Beginning again at the same point used in the description of FIG. 1, on the left hand side, middle portion of FIG. 2 is shown microphone 20. Microphone 20, of which there may be more than one as shown, connects with volume control potentiometer R100 and parallel resistor R1 to selectively reduce the audio signal from the microphone in accordance with the volume sought on the output on the earphones later discussed. The audio signal from the microphone 20 then passes dc isolation capacitor C1 to input to the base of preamp transistor Q4. The base of transistor Q4 is dc biased through means of resistor divider network R2 and R3. The collector of transistor Q4 is attached to B+ first connecting series resistors R4 and R5. Between resistor R4 and R5 is dc de-coupling capacitor C2 which grounds any electrical spikes which might appear on B+. The emitter of transistor Q4 is dc biased by resistor R6 with ac grounding capacitor C3 paralleling resistor R6. The output of transistor Q4 is taken from the collector where it is directed to the positive input of operational amplifier 24 after being dc isolated by series capacitors C4 and C5. The output of Q4 is also directed to operational amplifier 34 which will be discussed later. Operational amplifier 24 is the first active element of band pass filter 2 as shown in FIG. 1 whereas operational amplifier 34 is a portion of low pass filter 4 shown in FIG. 1.

Operational amplifier 24 is wired as shown in the FIGURE to operate as an active high pass filter, passing all audio signals having a frequency greater than 500 hz. Operational amplifier 24 is connected as a high pass RC active filter, with resistor R7 and R8 controlling the pass band gain using a portion of the output feedback to the negative input. This is determined by the ratio of R8 to R7. Resistor R7 is connected to the voltage source ½B+. As shown at the bottom of FIG. 2, the voltage ½B+ is obtained from voltage B++ through a resistor divider network comprising resistor R66 in series with resistors R67 and R68, with one/half B+ being taken at the connection between the two equal resistors, R67 and R68. Noise on the one/half B+ line is grounded by means of bypass capacitor C38 also connected at midpoint between R67 and R68.

A portion of the output of op amp 24 is also fed back to its positive input by means of R10 which, in conjunction with capacitors C4 and C5, form the frequency control of this filter. A gain of one is selected for this circuit and a Q of 10 is used for a 12 db per octive slope of the frequency roll off. In addition, the positive input to operational amplifier 24 is positively biased by means of resistor R9 connected between it and one/half B+. The output of operational amplifier 24, which are audio signals greater than 500 hz is directed to the positive input of operational amplifier 26, and to the positive input of operational amplifier 30. Operational amplifier 26 is the low pass filter portion of band pass filter 2 shown in FIG. 1 and it passes only audio signals below 4 khz. Operational amplifier 30 is the high pass filter 3 shown in FIG. 1 and it will be discussed later.

As previously mentioned, the output of operational amplifier 24 is coupled into the positive input of operational amplifier 26 by means of capacitor C6. In addition, the input is dc biased by means of resistor R12 connecting it with the voltage source one/half B+ previously discussed. Op amp 26, being a low pass RC active filter, uses resistors R15 and R14 to set the pass band gain to unity. A portion of op amp 26 output is used with capacitor C8 in conjunction with resistors R13 and R16 and capacitor C7 for feedback. This forms the frequency determining network to select a Q of 10 and a 12 db per octive slope for the frequency roll off. In addition, the output of op amp 26 is loaded by resistor R17. The output of operational amplifier 26 is the output of band pass filter 2 as shown in FIG. 1 and comprises audio signals in the range of 500 hz to 4 khz.

Proceeding downward from the band pass filter 2, high pass filter 3, as shown in FIG. 1, is detailed comprising operational amplifiers 30 and 32, the positive input to amplifier 30 receiving the output of the high pass filter portion of band pass filter 2, namely, the output of operational amplifier 24. Op amp 24 is loaded by resistor R11. A portion of the output of operational amplifier 30 is also fed back to its positive input by means of R26 which, in conjunction with capacitors C12 and C13, form the frequency control of this filter. A gain of one is selected for this circuit and a Q of 10 is used for a 12 db per octive slope of the frequency roll off. Lastly, the output of op amp 30 is then directed to the positive input of amplifier 32 after passing through coupling capacitor C14. The positive input to op amp 32 is also dc biased by means of resistor R27 tied to one/half B+. The op amp gain is selected by the ratio of R28 and R29, R29 being the feedback and R28 being reference to ac ground. Both operational amplifiers 30 and 32 comprise the high pass filter 3 as shown in FIG. 1 and pass audio signals above a frequency of 6 khz.

Turning now to the low pass filter 4 as shown in FIG. 1, and as had been previously mentioned, the output of preamp 1 shown in FIG. 1, namely transistor Q4, is directed to the positive input of operational amplifier 34 through a coupling capacitor C17. Operational amplifier 34, being a low pass RC active filter, uses resistors R35 and R34 to set the gain to one. A portion of operational amplifier 34 output is used with capacitor C19 in conjunction with resistors R36 and R37 and capacitor C18 for feedback. This forms the frequency determining network to select a Q of 10 and a 12 db per octive slope for the frequency roll off. Thereafter, the output of op amp 34 is directed to the positive input of op amp 36, first being coupled through capacitor C20 and the positive input also being dc biased by means of resistor R38 connected to one/half B+. The gain of the op amp 36 is set by the ratio of resistor R40 to R39, R40 being the feedback and R39 being reference to ac ground by being tied to ½B+. The output of op amp 36 then is the output of low pass filter 4 as shown in FIG. 1 and passes only audio signals below the frequency of 200 hz.

The outputs of high pass filter 3 and low pass filter 4 as shown in FIG. 1 are combined in rectifier/mixer 6 comprising in FIG. 4, firstly the dc isolation capacitors C15 attached to the output of op amp 32 and capacitor C21 connected to the output of op amp 36. Resistors R30 and R41 provide a discharge path for C15 and C21 to ground. The audio output of both op amp 32 and 36 are each half wave rectified by means of diodes D2 and D3 respectively, and then the outputs (after the diodes) are combined and will be directed to the negative input of comparator 38 which will be later discussed. However, prior to the entry into the negative input of comparator 38, charging resistor R31 is in line with the combined outputs of diodes D2 and D3. The output then goes to capacitor C16 which filters out any abrupt change in the voltage coming from the high and low pass filters. The rate at which the system will respond to changes in the noise range is controlled by the RC time constant of R31 and C16. The rate at which the system will recover from loud noise is controlled by the RC time constant of R32 and C16. This is the output of the high pass and low pass filters which will be compared to the output of the band pass filter by high input impedance comparator 38.

Returning now to the output of band pass filter 2 as shown in FIG. 1, the output of operational amplifier 26 is loaded by means of resistor R17 and then directed to the positive input of operational amplifier 28 after being dc isolated by capacitor C9. In addition, the output of op amp 26 is also directed to attenuator 11 as shown in FIG. 1 (this will be discussed shortly). The gain of op amp 28 is determined by feedback resistors R20 and R19. Resistor R19 is connected to voltage source ½B+. Resistor R20, which is a potentiometer, is the sensitivity adjust pot for the system. Such sensitivity adjust is manipulated so that the override of the intercom does not function until a person speaking into the microphone, together with noise in the band pass filter, exceeds the road noise in the low and high frequency range. Once the value of resistor R20 is adjusted in an actual trial on the road at, say 55 miles per hour, it will need not be readjusted again.

Continuing, the output of op amp 28 then is dc isolated by means of capacitor C10 and continued on to half wave rectifier diode D1, the line first being tied to ground through resistor R21. After half wave rectifier diode D1, the resultant positive signal then charges capacitor C11, similarly as did the outputs of diodes D2 and D3 from the high pass filter and the low pass filter, to form a dc voltage dependent on the energy level in the audio range of 200 hz to 4 khz, and then inputted to comparator 38. The recovery or on time after the last communication is controlled by discharge resistor R22 to ground in the RC ratio of R22 to C11.

Thus, appearing at the positive input of high input impedance comparator 38 is the positive dc voltage from charged capacitor C11 (rectifier 5 of FIG. 1). The combined positive voltage outputs of op amp 32 and 36, after rectification through diodes D2 and D3 and charging capacitor C16 (high pass and low pass filters 3 and 4 FIG. 1), places a positive voltage upon the negative input of comparator 38 for voltage comparison with the output of op amp 28 as represented by the voltage on capacitor C11.

Comparator 38 operates such as to have a positive output only during those times when its positive dc voltage input (from band pass filter) exceeds the positive dc voltage to its negative input (from high pass and low pass filters).

Before discussing how the output of comparator 38 is used, the attenuators 8 and 10 as shown in FIG. 1 will be first discussed. To attenuator 8 is directed the left stereo input from a stereo radio receiver or stereo cassette player and is illustrated in the upper right hand portion of the circuitry shown in FIG. 2. Firstly, the signal is inputted to terminal 17 where it is resistance divided by means of resistor divider network comprising resistors R42 and R43, these resistors also loading the output of the signal source, with the center point then continuing into coupling capacitor C22. Thereafter, the resistor signal reduction circuit, which permits the reduction of the left stereo output during times of intercom usage is detailed showing series resistors R45 and R46, the combined resistors then being shunted by resistor R44. At the junction of resistors R45 and R46 is connected the collector of transistor Q1, which grounds that point during intercom usage and will be discussed later. From the junction of resistors R44 and R46, the signal is again coupled by means of capacitor C23 into the input of power amplifier 42. Power amplifier 42 in FIG. 1 comprises the active element of the power amplifier block 9 shown in FIG. 1.

The first and second inputs to the integrated circuit comprising power amplifier 42 are bypassed by capacitor C24. The output is high frequency bypassed through capacitor C27 to ground. Amp 42 gain is set by the ratio of R49 and R50 and then fed back to the second input through capacitor C25. In addition, power amplifier 42 is connected to B++, being ac bypassed by capacitor C26 to ground. The output of power amplifier 42 then is coupled to terminal 18 by capacitor C28, and on to the left earphone of both the helmet earphones of the rider and the passenger on the motorcycle.

The other stereo input, namely the right side stereo input from the FM radio or stereo tape player is directed into attenuator 10 as shown on FIG. 1 and which is shown in complete detail in the upper right hand corner of FIG. 2. Like the left hand stereo attenuator 8, the input from the stereo radio receiver is connected to terminal 19 and is voltage divided through resistors R51 and R52, which also loads the signal source. This is coupled through capacitor C29 and then series resistor R53. Attached following resistor R53 is the collector output of transistor Q2, the base of which receives the output of comparator 7 previously discussed to ground the right input during times of intercom activity and which will discussed shortly. Continuing on, the right side stereo input then is referenced to ground by means of grounding resistor R57 and then continues on into series resistor R56 and capacitor C30. Thereafter, capacitor C30 feeds into the first input of power amplifier 44, power amplifier 44 being the active element of the power amplifier block 12 shown in FIG. 1. Attached also to the input of power amplifier 44 is the output of band pass filter 2, the connection first being interrupted by attenuator 11 (transistor Q3) as shown in FIG. 1. This will also be discussed shortly.

Both the inputs of power amplifier 44 are bypassed by capacitor C32 and then like power amplifier 42, the output gain set by the ratio of R62 and R63 and then coupled back to the input through capacitor C33. The output then is directed to terminal 21 and on to the left earphone of the helmet earphones of both the driver and the passenger after passage through capacitor C36. Here again, the B++ input to power amplifier 44 is bypassed to ground through capacitor C34 to eliminate high frequency electrical spikes or oscillations. The amplifier is also grounded.

Now an explanation of how the output of comparator 38 affects operation of the invention. As indicated earlier, comparator 38 emits a signal which reduces the stereo output on both left earphones by approximately one/half when a party speaks into the microphone to utilize the intercom system or when a sound greater than the usual noise level enters the always activated microphone. At the same time, the output of comparator 38 completely cuts off the stereo sounds from the radio or tape cassette player in both right side earphones where, through a separate yet to be discussed electronic network shown in FIG. 2, the speaking voice or sound greater than noise level received by the microphone is heard by both right earphones being used as an intercom system. As previously discussed, comparator 38 has a positive output only when there is sufficient energy exiting from the band pass filter operational amplifier 26.

At that time, the output level of comparator 38 is placed upon the base of transistor Q2 situated near the upper right hand corner of FIG. 2. The output of comparator 38 is first resistor divided to ground by means of resistors R54 and R55 with their joinder point connected to the base of transistor Q2 where the emitter of transistor Q2 is grounded. Upon the appearance of a positive voltage greater than the voltage drop across the base emitter unction (nominally 0.7 volts), transistor Q2 will be turned on and thus grounding the collector connected to the right side output of the stereo radio or stereo multiplex player, thus terminating any input into power amplifier 44 by reducing it to zero at that point.

The input from the microphone 20 as shown in FIG. 2, is directed to the input of power amplifier 44 by directing the output of the band pass filter operational amplifier 26 through series capacitor C37 and resistor R61 and then on to both series resistor R60 and capacitor C31 and also to the collector of transistor Q3. The emitter of Q3 is connected to B+ and the base is connected to the output of comparator 38 through a resistor divider network comprising resistors R59 and R58, the other end of resistor R58 connected to B+. Q3, when turned on, provides an ac ground to B+ for the output of operational amplifier 26 through capacitor C37 and resistor R16. At most instances, and when there is no output from comparator 38, transistor Q3 is constantly on since the voltage to its base is determined through the current path from B+ to ground through resistors R58, R59, R54, and R55. However, when there is an output from comparator 38, voltage upon the base of Q3 rises and thus turns the transistor off and permitting the audio signal from operational amplifier 26 to proceed through resistor R60 and capacitor C31 to the input of power amplifier 44 and thus to terminal 21 and on to both right earphones.

In addition, the output of comparator 38 is also directed to the base of Q1 which is operably attached to the input of power amplifier 42 which powers both left earphones. When there is a positive output from comparator 38, transistor Q1 is turned on since its base is attached to the central point between voltage divider resistors R48 and R47. At that time, the collector is grounded through the emitter of transistor Q1 and thus grounds the junction of resistors R45 and R46 so that the sole path of the left audio channel from the radio or tape cassette player is through resistor R44 and is at a level reduced approximately one/half as to when resistors R45 and R46 were in parallel with resistor R44 and not grounded. Thus the input to power amplifier 42 is diminished by a factor such that its output is reduced by approximately one/half the sound previously heard in the right earphones.

With the above explanation, the operation of the invention has been described. The only part remaining is the power supply which supplies the operational voltages to the circuit. That power supply is shown in the lower portion of FIG. 2 and firstly is derived by attachment of terminals 25 and 27 to the positive and negative terminals respectively of the battery of the motorcycle. The positive side is then led to fuse F1 and then through choke L1. To assure that no negative spikes are residing on the positive power line, diode D4, in line with the current, then passes only the positive directed current. The output of diode D4 is directed to the input of voltage regulator VR1, an integrated circuit whose output is a regulated 9.8 volts which has been termed B++. The regulated output has two bypass capacitors attached to it namely, capacitors C41 and C42. From the 9.8 volt B++ output, resistor R64 feeds back to input 1 of VR1 and on to parallel ground combination of R65 and C40. An output of 8.8 volts, hereinbefore referred to as B+, is obtained from the 9.8 volt B++ by means of resistor R66. Capacitor C43 bypasses electrical spikes which might appear on B+. The negative side from the battery in the motorcycle is directed to a second choke, L2 and then grounded. Capacitor C39 then connects the ground of the output of D4.

The voltage which has been referred to previously as one/half B+ is obtained through a voltage divider network shown connecting to the power supply B+ comprising a resistance divider network of R67 and R68, both being equal voltage with the opposite end of resistor R67 connected to the 8.8 volts and resistor R68 grounded. Also, at the central point between resistors R67 and R68 where the one/half B+ is obtained is connected a bypass capacitor C38. This also establishes this point as an ac ground point.

The following is a parts list of the different elements comprising the invention.

| RESISTORS | | | |
|---|---|---|---|
| R1 | 220 | R36 | 10K |
| R2 | 1 M | R37 | 10K |
| R3 | 330K | R38 | 330K |
| R4 | 68K | R39 | 1K |
| R5 | 10K | R40 | 10K |
| R6 | 270 | R41 | 47K |
| R7 | 27K | R42 | 68 |
| R8 | 33K | R43 | 82 |
| R9 | 10K | R44 | 22K |
| R10 | 10K | R45 | 4.7K |
| R11 | 1K | R46 | 15K |
| R12 | 220K | R47 | 2.2K |
| R13 | 10K | R48 | 10K |
| R14 | 27K | R49 | 220 |
| R15 | 33K | R50 | 15 |
| R16 | 10K | R51 | 47 |
| R17 | 1K | R52 | 220 |
| R18 | 330K | R53 | 4.7K |
| R19 | 1K | R54 | 10K |
| R20 | 10K Pot | R55 | 2.2K |
| R21 | 47K | R56 | 15K |
| R22 | 82K | R57 | 470K |
| R23 | 22K | R58 | 2.2K |
| R24 | 33K | R59 | 10K |
| R25 | 10K | R60 | 4.7K |
| R26 | 10K | R61 | 4.7K |
| R27 | 330K | R62 | 220 |
| R28 | 1K | R63 | 15 |
| R29 | 10K | R64 | 220 |
| R30 | 47K | R65 | 1.5K |

-continued

| | | | |
|---|---|---|---|
| R31 | 33K | R66 | 47 |
| R32 | 470K | R67 | 1K |
| R33 | 220K | R68 | 1K |
| R34 | 39K | R100 | 5K |
| R35 | 33K | | |

CAPACITORS

| | | | |
|---|---|---|---|
| C1 | 1 uf | C24 | .01 uf |
| C2 | 10 uf | C25 | 100 uf |
| C3 | 10 uf | C26 | .47 uf |
| C4 | .03 uf | C27 | .47 uf |
| C5 | .03 uf | C28 | 220 uf |
| C6 | 4.7 uf | C29 | 1 uf |
| C7 | .004 uf | C30 | .1 uf |
| C8 | .004 uf | C31 | .1 uf |
| C9 | .1 uf | C32 | .01 uf |
| C10 | 1 uf | C33 | 100 uf |
| C11 | 10 uf | C34 | .47 uf |
| C12 | .0015 uf | C35 | .47 uf |
| C13 | .0015 uf | C36 | 220 uf |
| C14 | .1 uf | C37 | 1 uf |
| C15 | .1 uf | C38 | 47 uf |
| C16 | 10 uf | C39 | .1 uf |
| C17 | 10 uf | C40 | 10 uf |
| C18 | .1 uf | C41 | .1 uf |
| C19 | .1 uf | C42 | 470 uf |
| C20 | .1 uf | C43 | 47 uf |
| C21 | 1 uf | | |
| C22 | 1 uf | | |
| C23 | .1 uf | | |

SEMICONDUCTORS

| | | |
|---|---|---|
| D1 | 1N914 | Signal |
| D2 | 1N914 | Signal |
| D3 | 1N914 | Signal |
| D4 | 1N914 | Signal |
| D5 | 1N4002 | Power |
| Q1 | 2N4401 | NPN Signal |
| Q2 | 2N4401 | NPN Signal |
| Q3 | 2N4403 | PNP Signal |
| Q4 | 2N4401 | NPN Signal |
| U1 | LM324 | Quad op amp |
| U2 | LM324 | Quad op amp |
| U3 | LM383 | Power amp |
| U4 | LN383 | Power amp |
| U5 | LM317 | Adj regulator |

MISCELLANEOUS

| | | |
|---|---|---|
| F1 | 2 Amp | Slow Blow |
| L1 | RFC | Inductor |
| L2 | RFC | Inductor |

Features which have been built into the subject invention is the relatively short time in which the VOX intercom may be utilized. For example, no resistive impediment is placed between the output of the band pass filter, operational amplifier 26, and the positive input to comparator 38. Accordingly, capacitor C11 charges rather rapidly to build the necessary voltage to turn on comparator 38 and quiet the previously existing stereo sounds and inject the intercom speaking. Similarly, the intercom system is kept alive for three to four seconds after the last word is spoken and no more energy is passed by the band pass filter to capacitor C11, where resistor R22 controls the discharge rate of capacitor C11, the capacitor whose voltage is inputted to the positive input of comparator 38. In contrast, the output of the combined low pass filter and high pass filter is charged through resistor R31 in series with capacitor C16, the charging capacitor which supplies the voltage to the negative input of comparator 38. This allows capacitor C16 to build up more slowly than capacitor C11 so that capacitor C11 will always predominate when there is energy in the band pass frequency region. Additionally, the discharging resistor R32 for capacitor C16 is of a greater value than the intercom capacitor C11 discharging resistor, R22. That way, the voltage on the negative input to comparator 38 does not present as formable a challenge to the intercom override.

Capacitors C11 and C16 which are charged up by the outputs of the band pass filter and high and low pass filters respectively, are energy storage devices charged by current from the respective filters. As such, the voltages on the capacitors, which are a function of stored electrical energy, are the voltages which are compared by comparator 38.

As mentioned previously, the device is installed and adjusted by taking a short tour on the motorcycle at a speed up to the speed of maximum noise interference, which will nominally be in the area of the speed limit whereupon the sensitivity adjust, namely feedback resistor R20 to amplifier 28, so that the normal usually noise in the band pass circuit does not exceed in energy value the noise in the low pass and high pass filters. Once that has been set, it need not be set again. The volume control potentiometer R100 on the microphone input will have to be adjusted simultaneously in order that the words spoken into the microphone will exceed the noise level as adjusted by the sensitivity adjust R20.

Figure 3:
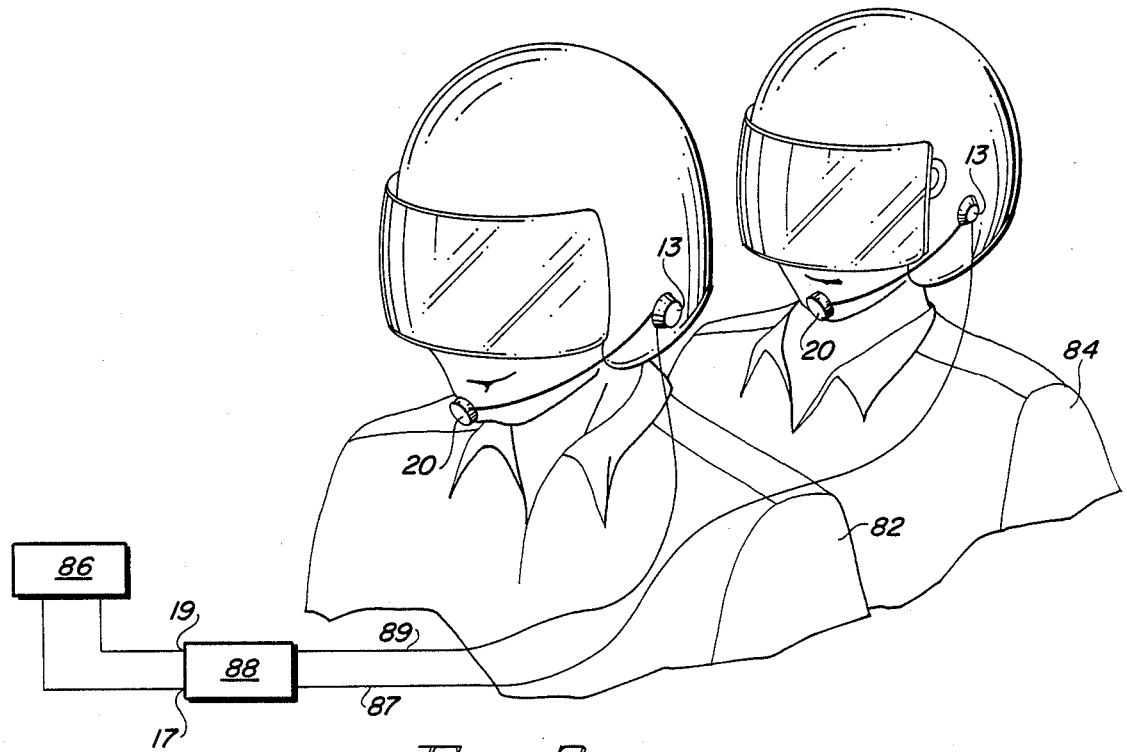
FIG. 3 is a combined perspective view and block schematic drawing of the subject invention with motorcycle rider and passenger.

Referring now to FIG. 3, a perspective view of a partial motorcycle driver and passenger, together with block schematic diagram of the invention is shown. For ease of drawing, the motorcycle is not shown, however, the relative positions of the motorcycle driver 82 to the passenger 84 is shown as they would be sitting on their respective seats on the motorcycle with the passenger behind the driver. Block 88 shows the container in which the electronic circuits of the invention are housed, additionally showing as inputs the left and right stereo channel from the associated stereo radio receiver or audio cassette player 86, each channel connecting with the appropriate terminals 17 or 19 as described in FIG. 2. Shown exiting from block 88 are the wire sets 89 and 87 running to the left earphones 13 and microphones 20 of the driver and passenger respectively. As had been earlier described, the microphone is attached to the helmet worn by each of the parties and is situated proximate each respective party's mouth. The earphones are mounted inside the helmets, however, for illustrative purposes, are shown as solid line elements in FIG. 3. The right earphones (not shown) are on the opposite side of each helmet and are connected by wiring in wire sets 99 and 87, crossing over from the left earphones.

While it is realized that the subject invention has been presented as an accessory for a motorcycle rider and passenger, it is apparent that the system may also be used in other types of noisy environments, such as, for example, a machine shop area. In this case, the output could be attached to headsets worn by the employees or, a loudspeaker on the wall. Here, only the right channel of the system would be utilized since usually announcement type wall mounted loudspeakers are not stereo equipped. In any event, having strategically placed open microphones around the machine shop would permit nearby properties to utilize same and would broadcast what was said over the din of the environment.

While a preferred embodiment of the device has been shown and described, it will be understood that there is no intent to limit the invention by such disclosure, but rather it is intended to cover all modifications and alternate constructions falling within the spirit and the scope of the invention as defined in the appended claims.

We claim:

1. Improvements in a motorcycle stereo audio system for a motorcycle rider and passenger, the improvements comprising:
   an intercom system adapted to receive a speaking voice and extraneous audio frequency noise and output a control signal when the speaking voice exceeds the extraneous audio frequency noise;
   a left attenuator and amplifier system adapted to receive as an input the left stereo channel of an associated stereo audio signal and to output the left stereo channel, said left attenuator and amplifier system also receiving said intercom system control signal output;
   a right attenuator and amplifier system adapted to receive as an input the right stereo channel of an associated stereo audio signal and to output the right stereo channel, said right attenuator and amplifier system also receiving said intercom system control signal output;
   an intercom attenuator operably connected to said right attenuator and amplifier system, said intercom attenuator receiving said speaking voice and control signal output from said intercom system whereby when the speaking voice exceeds the extraneous audio frequency noise, said intercom system control signal output attenuates said left stereo channel of the associated stereo audio system, terminates the right stereo channel of the associated stereo audio system, and inputs said speaking voice from said intercom attenuator into the right attenuator and amplifier system to output said speaking voice.

2. The improvements in a motorcycle stereo audio system as defined in claim 1 wherein said intercom system further includes a plurality of microphones to convert the speaking voice and extraneous audio frequency sounds to electrical signals, a preamplifier operably attached to said microphones, and a plurality of filters operably connected to said preamplifier, said filters adapted to segregate the speaking voice signals from the extraneous audio frequency noise signals.

3. The improvements in a motorcycle stereo audio system as defined in claim 2 wherein said plurality of filters includes a band pass filter adapted to segregate the speaking voice signals, and a high pass filter and low pass filter to segregate the extraneous audio frequency noise signals.

4. The improvements in a motorcycle stereo audio system as defined in claim 3 wherein said intercom system further includes a rectifier and first energy storage device operably connected to said band pass filter to rectify and store the energy content of the speaking voice electrical signals, and a rectifier/mixer and second energy storage device operably connected to said high pass filter and said low pass filter, said rectifier/mixer receiving the extraneous audio frequency noise signals, summing them, rectifying them, and storing the energy content of the extraneous audio frequency noise signals.

5. The improvements in a motorcycle stereo audio system as defined in claim 4 wherein said intercom system still further includes a comparator, said comparator operably connected to said rectifier and first energy storage device and said rectifier/mixer and second energy storing device to compare the energy stored on each respective storage device, said comparator operating to output a control signal when the energy stored in said first storage device exceeds the energy stored in said second storage device.

6. The improvements in a motorcycle stereo audio system as defined in claim 5 further including a plurality of left hand speakers, said left speakers operably connected to said left attenuator and amplifier system, and a plurality of right hand speakers, said right hand speakers operably attached to said right attenuator and amplifier system whereby the associated stereo audio signal left stereo channel and right stereo channel output their audio sounds on the left hand speakers and right hand speakers respectively.

7. The improvements in a motorcycle stereo audio system as defined in claim 6 wherein said intercom attenuator is operably connected to said intercom system band pass filter.

8. The improvements in a motorcycle stereo audio system as defined in claim 7 wherein said right attenuator and amplifier system includes means to terminate the associated stereo audio signal right stereo channel and said left attenuator and amplifier system includes means to attenuate the associated stereo audio signal left stereo channel, said means to terminate the right stereo channel defining means to ground the associated stereo audio signal right stereo channel and said means to attenuate the left stereo channel defining means to ground a portion of the associated stereo audio signal left stereo channel.

9. The improvements in a motorcycle stereo audio system as defined in claim 8 wherein said means to terminate the associated stereo audio signal right stereo channel defines a first transistor, said transistor receiving the output control signal of said comparator, and said means to ground a portion of the associated stereo audio signal left stereo channel defines a second transistor, said second transistor also receiving said comparator output control signal whereby when said comparator outputs its control signal, said first transistor grounds said right stereo channel and said second transistor grounds a portion of the left stereo channel and thereby attenuates it.

10. The improvements in a motorcycle stereo audio system as defined in claim 9 wherein said intercom attenuator includes means to permit input of said speaking voice into said right attenuator and amplifier system, said means to permit defining a third transistor, said third transistor operably connected to said comparator control signal output and said right attenuator and amplifier system whereby when said comparator outputs its control signal, said third transistor permits the input of said speaking voice into said right attenuator and amplifier system for the duration of said control signal.

11. The improvements in a motorcycle stereo audio system as defined in claim 10 wherein said intercom system further includes means to delay restoration of the associated stereo audio signal left stereo channel and restoration of the associated stereo audio signal right stereo channel for a set period of time following the termination of said speaking voice, said means defining a discharge resistor operably attached to said first energy storage device whereby there will be a delay after the termination of said speaking voice before the associated stereo audio signals are fully restored in order that there may be further speaking voices if desired.

12. The improvements in a motorcycle stereo audio system as defined in claim 11 wherein said intercom system further including means to resist the restoration of the associated stereo audio signals following termination of said speaking voice, said means including a resistor operably connected to said second energy storage device, said resistor in line with said second energy storage device whereby signals to charge said second energy storage device to overcome said first energy storage device at said comparator are resisted by said resistor.

13. The improvements in a motorcycle stereo audio system as defined in claim 12 wherein said rectifier includes means to sensitize the operation of said comparator, said means to sensitize including a variable gain feedback amplifier operably connected between said band pass filter and said first energy storage device, said means to sensitize defining a variable resistor operably attached to said amplifier feedback whereby said variable resistor varies the gain of said amplifier to reduce or increase the band pass filter output to said first energy storage device and thereby sensitize the operation of said comparator.

14. The improvements in a motorcycle stereo audio system as defined in claim 13 wherein said left hand speakers and right hand speakers respectively comprise left earphones and right earphones respectively.

15. The improvements in a motorcycle stereo audio system as defined in claim 14 wherein said band pass filter is comprised of resistors and capacitors to pass signals having frequencies in the range of 500 hz to 4 khz, said low pass filter is comprised of resistors and capacitors to pass signals having a frequency less than 200 hz, and said high pass filter is comprised of resistors and capacitors to pass signals having a frequency greater than 6 khz.

16. The improvements in a motorcycle stereo audio system as defined in claim 15 wherein said band pass filter is a high pass active operational amplifier filter adapted to pass signals having a frequency greater than 500 hz and a second RC active operational amplifier filter adapted to cut off signals having a frequency greater than 4 khz; said high pass filter is an active operational amplifier filter; and said low pass filter is an active operational amplifier filter.

17. The improvements in a motorcycle stereo audio system as defined in claim 16 wherein said rectifier/mixer includes a first fixed gain amplifier and first diode, said first fixed gain amplifier connected to said high pass filter and outputting electrical signals having frequencies greater than 6 khz to said first diode, said first diode then outputting a high frequency half wave rectified signal, and a second fixed gain amplifier and second diode, said second amplifier operably attached to said low pass filter and outputting electrical signals having frequencies less than 200 hz to said second diode, said second diode then outputting a low frequency half wave rectified signal, both said high frequency half wave rectified signal and said low frequency half wave rectified signal summed and directed to said second energy storage device, and said second energy storage device comprises a capacitor.

18. The improvements in a motorcycle stereo audio system as defined in claim 17 wherein said left attenuator and amplifier system comprises means to increase the resistance to the passage of said left stereo channel, said means of resistance including paralleled resistors, one parallel leg of which may be grounded in order that the left stereo channel must go through said other parallel resistor and thus have its resistance to flow increased whereby when one of said parallel resistors is grounded, the signal to the amplifier is reduced thereby reducing the output in said left speaker.

19. The improvements in a motorcycle stereo audio system as defined in claim 18 wherein said second energy storage device comprises a capacitor.

* * * * *